US006627534B1

United States Patent
Lee (10) Patent No.: US 6,627,534 B1
(45) Date of Patent: Sep. 30, 2003

(54) SEMICONDUCTOR FABRICATION PROCESS AND STRUCTURE WITH MINIMAL CAPACITIVE COUPLING BETWEEN CONDUCTORS

(76) Inventor: Henry F. Lee, 2167 Wellington Dr., Milpitas, CA (US) 95035

( * ) Notice: Subject to any disclaimer, the term of this patent is extended or adjusted under 35 U.S.C. 154(b) by 0 days.

(21) Appl. No.: 09/777,354

(22) Filed: Feb. 5, 2001

(51) Int. Cl.[7] .............................................. H01L 21/768
(52) U.S. Cl. ....................................... 438/624; 438/637
(58) Field of Search ................................. 438/622, 624, 438/637, FOR 438

(56) References Cited

U.S. PATENT DOCUMENTS 5,488,015 A * 1/1996 Havemann et al.
6,071,805 A * 6/2000 Liu
6,165,890 A * 12/2000 Kohl et al.
6,313,046 B1 * 11/2001 Juengling et al.
2001/0016412 A1 * 8/2001 Lee et al.

\* cited by examiner

*Primary Examiner*—George Fourson
(74) *Attorney, Agent, or Firm*—Edward S. Wright

(57) ABSTRACT

Semiconductor fabrication process and structure in which an evaporative material is deposited in a space between two conductors, a layer of porous material is formed adjacent to the evaporative material, and the evaporative material is evaporated through the porous material to leave a closed empty space between the conductors. The empty space has a dielectric constant on the order of 1.0, which minimizes capacitive coupling between the conductors.

17 Claims, 15 Drawing Sheets

FIG_1
(PRIOR ART)

FIG_2

FIG_3A
(PRIOR ART)

FIG_3B
(PRIOR ART)

FIG_3C
(PRIOR ART)

FIG_3D
(PRIOR ART)

FIG_3E (PRIOR ART)

FIG_3F (PRIOR ART)

FIG_3G (PRIOR ART)

FIG_3H (PRIOR ART)

FIG_4A

FIG_4B

FIG_4C

FIG_4D

FIG_4E

FIG_4F

FIG_5A
(PRIOR ART)

FIG_5B
(PRIOR ART)

FIG_5C
(PRIOR ART)

FIG_5D
(PRIOR ART)

FIG_5E
(PRIOR ART)

FIG_5F
(PRIOR ART)

FIG_5G
(PRIOR ART)

FIG_5H
(PRIOR ART)

FIG_5I
(PRIOR ART)

FIG_5J
(PRIOR ART)

FIG_6A

FIG_6B

FIG_6C

FIG_6D

FIG_6E

FIG_6F

FIG_6G

FIG_6H

FIG_6I

FIG_6J

FIG_7A

FIG_7B

FIG_7C

FIG_7D

FIG_7E

FIG_7F

FIG_7G

FIG_7H

FIG_7I

FIG_7J

FIG_7K

FIG_7L

FIG_7M

FIG_7N

FIG_8A

FIG_8B

FIG_8C

*FIG_8D*

*FIG_8E*

*FIG_9*

SEMICONDUCTOR FABRICATION PROCESS AND STRUCTURE WITH MINIMAL CAPACITIVE COUPLING BETWEEN CONDUCTORS

This invention pertains generally to semiconductor devices and, more particularly, to a fabrication process and structure in which capacitive coupling between conductors is minimized.

As semiconductor integrated circuits decrease in size and increase in speed, electrical interaction through capacitive coupling, or cross talk, becomes a limiting factor. As circuit conductors get closer together and/or switching speeds increase, capacitive coupling increases.

The capacitance between two conductors is directly proportional to the surface area of the sides of the conductors facing each other and the dielectric constant of the material between them, and inversely proportional to the spacing between the conductors.

Conventional insulators such as silicon dioxide ($SiO_2$) have dielectric constants on the order of 4.0 to 4.6, and in order to reduce capacitive coupling, there have been some attempts to replace those insulators with materials having lower dielectric constants. Materials having dielectric constants on the order of 2.2 to 2.7 have been investigated in laboratories, but have not been used on a commercial basis. They only reduce the capacitance by a factor of about 2, and there are a number of other problems with them. Those problems include poor adhesion, inability to withstand chemical mechanical polishing (CMP), difficulty in anisotropic etching, poor stop selectivity over and under other films, low temperature ratings which limit subsequent process steps, and the need for protective liners to prevent the dielectric material from reacting with the metal conductors.

A few so-called ultra low K materials have also been investigated. Those materials have dielectric constants of about 2, and are subject to the same problems as the other alternative materials. In addition, they require new processes that are not well understood, they have low yields, and they require new process control and material delivery equipment.

Figure 1:
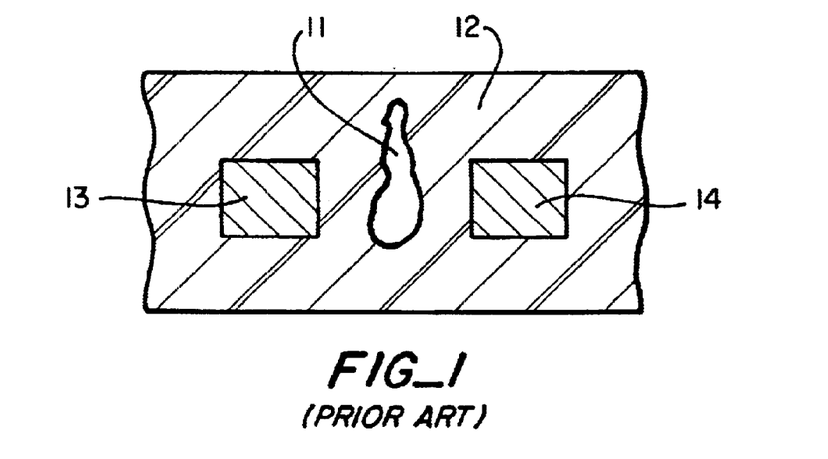
FIG. 1 is a cross-sectional view of a prior art device.

There have been some attempts to use voids to reduce the capacitance between conductors, with the tops of the voids being pinched off as a result of non-conformal deposition. An example of a device made by this technique is illustrated in FIG. 1 where a void 11 is formed in the oxide 12 between conductors 13, 14. This process is not well controlled or uniform across the wafer, which causes the height and width of the voids to vary. The voids also vary in size and shape with changes in line spacing. These variations make the capacitive coupling unpredictable, which makes circuit design difficult or impossible.

It is in general an object of the invention to provide a new and improved semiconductor fabrication process and structure.

Another object of the invention is to provide a fabrication process and structure of the above character which significantly reduces capacitive coupling between conductors.

These and other objects are achieved in accordance with the invention by providing a semiconductor fabrication process and structure in which an evaporative material is deposited in a space between two conductors, a layer of porous material is formed adjacent to the evaporative material, and the evaporative material is evaporated through the porous material to leave a closed empty space between the conductors. The empty space has a dielectric constant on the order of 1.0, which minimizes capacitive coupling between the conductors.

Figure 2:
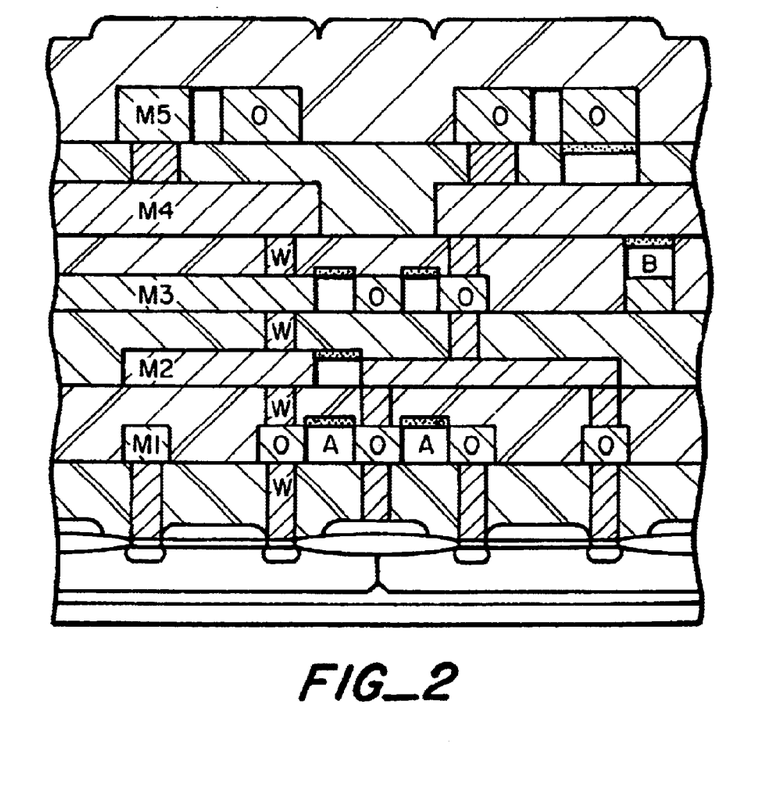
FIG. 2 is a cross-sectional view of a semiconductor structure in which the invention can be utilized.
Figure 3A:
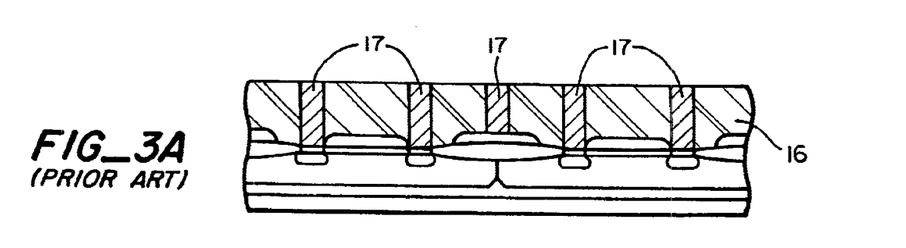
FIGS. 3A–3H are cross-sectional views illustrating the steps in one prior art process for fabricating a semiconductor device.
Figure 3B:
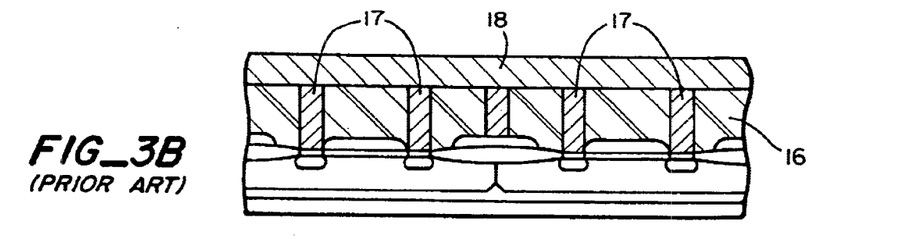
Figure 3C:
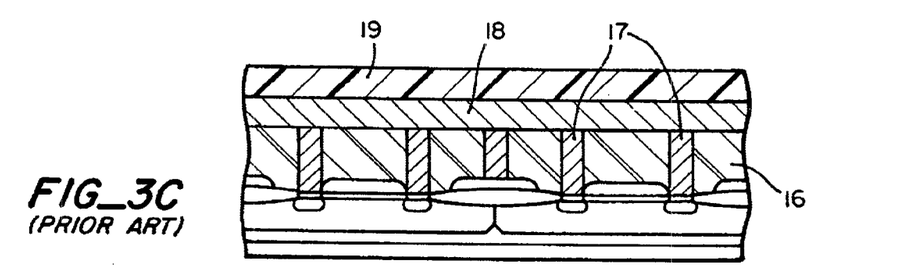
Figure 3D:
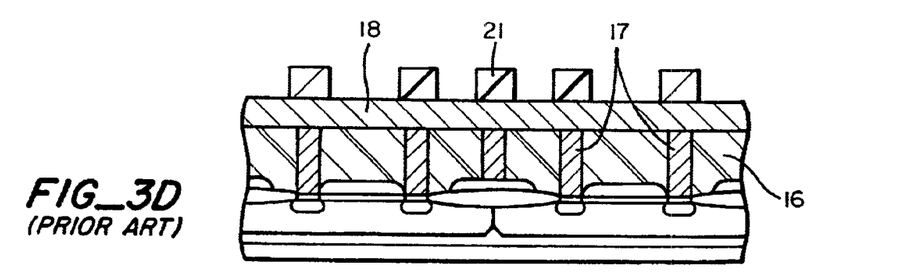
Figure 3E:
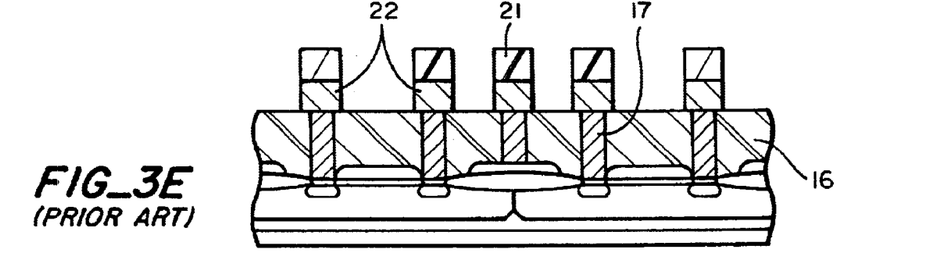
Figure 3F:
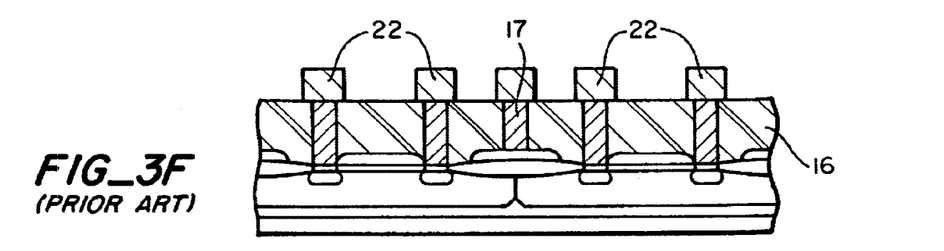
Figure 3G:
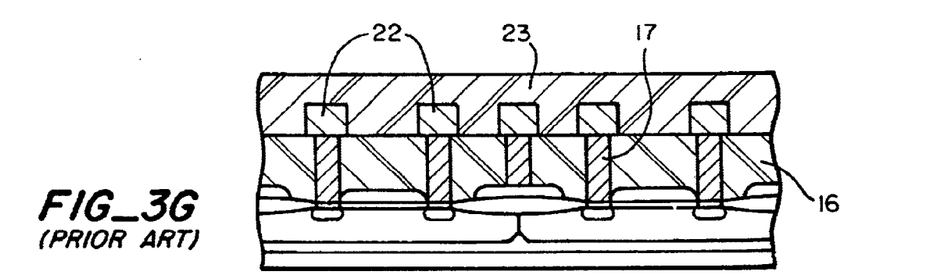
Figure 3H:
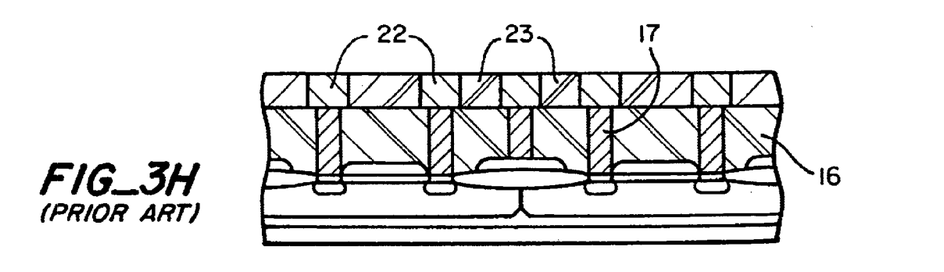

In order to better understand the situations in which the invention is best employed, FIG. 2 illustrates a typical semiconductor device which has a number of metal layers. Conductors marked "O" extend into and out of the plane of the page, and those marked with arrows are parallel to the page. Capacitive coupling between vias ("W") is not a problem because even though the vias may be closely spaced, their surface areas are small. Conductors which are connected by vias likewise do not present a problem because they are already coupled directly together. The need for the invention arises between conductors which are closely spaced and have long parallel paths, e.g. the regions marked "A" and "B". The conductors which give rise to the problem can be in the same layer of metallization like the conductors separated by region "A", or they can be in successive layers like the conductors separated by region "B".

In the prior art process illustrated in FIGS. 3A–3H, the device is formed on a silicon wafer and includes an insulating layer of $SiO_2$ or BPSG (boro phospho silicate glass) 16, with tungsten plugs 17. A metal layer 18 is deposited over the insulating layer and the plugs, then coated with a layer of photoresist 19. The photoresist is patterned to form a mask 21, and the metal layer is etched through the mask to form conductors 22 which are aligned with the tungsten plugs. The photoresist is removed, and another layer of nonconductive material 23 such as $SiO_2$ is deposited. That layer is then polished by chemical mechanical polishing (CMP) to planarize the wafer with the $SiO_2$ level with the tops of the conductors.

In this device, the capacitance between conductors 22 is proportional to the height and length of the side walls of the conductors and to the dielectric constant of the $SiO_2$ between them. This capacitance is reduced significantly by the invention.

Figure 4A:
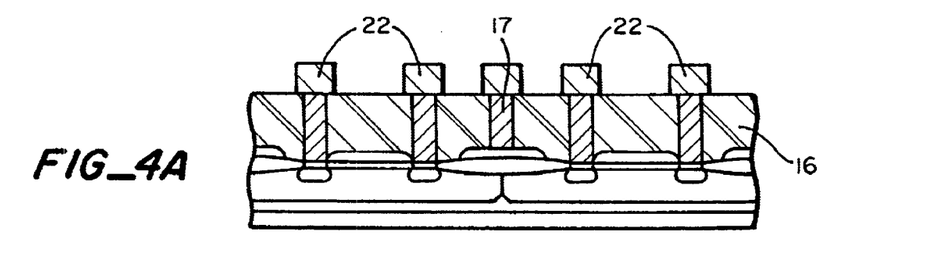
FIGS. 4A–4F are cross-sectional views illustrating the steps in one embodiment of a process for fabricating a semiconductor device in accordance with the invention.
Figure 4B:
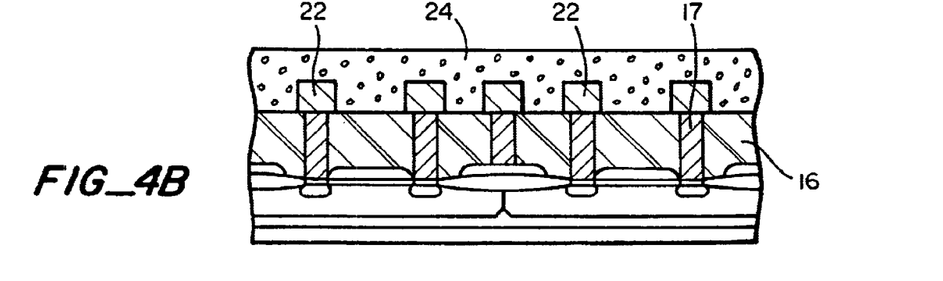
Figure 4C:
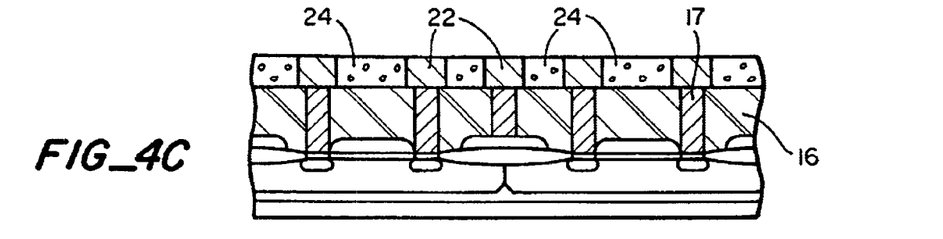
Figure 4D:
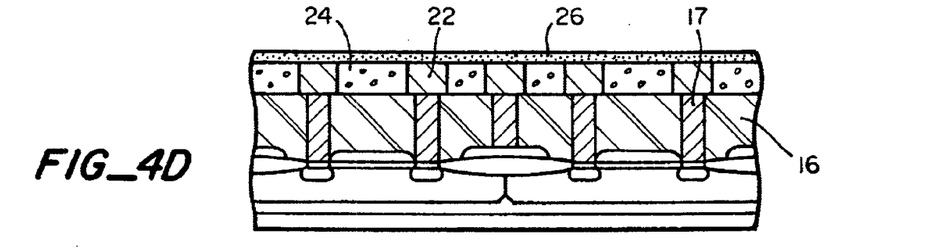
Figure 4E:
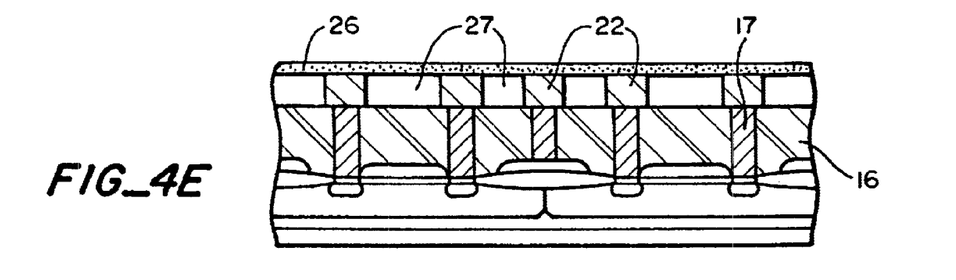
Figure 4F:
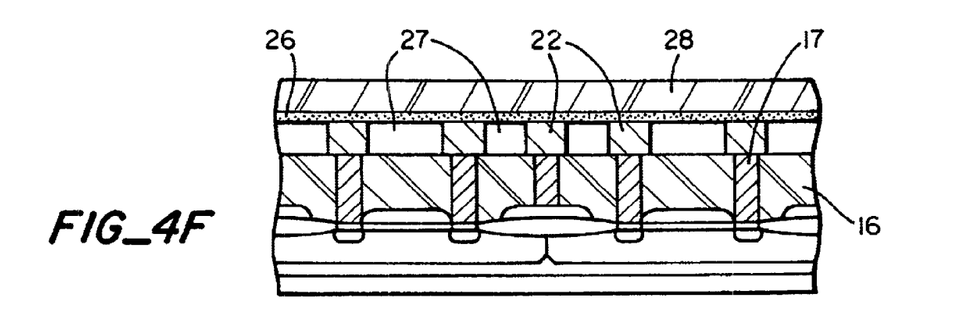

As illustrated in FIGS. 4A–4F, once conductors 22 are formed, as for example by the process of FIGS. 2A–2H, a layer of evaporative material 24 is formed over them and between them. The evaporative material is etched down to the level of the conductors, leaving it only in the spaces between the conductors, as illustrated in FIG. 4C.

A thin layer 26 of porous material such as $SiO_2$ is deposited over the evaporative material and the upper surfaces of the conductors. Thereafter, the wafer is heated to vaporize the evaporative material and expel it through the porous material, leaving empty spaces 27 which contain only air, a desired gas such as argon, or a partial vacuum between the conductors. The air or partial vacuum has a dielectric constant of about 1.0, which reduces the capacitance between the conductors by a factor of about four as compared with prior art devices utilizing $SiO_2$.

The porous material bridges between the conductors and closes the empty spaces. One or more additional layers 28 can be formed over the porous material and processed as may be required for the device which is being fabricated. The additional layers can, for example, include oxide, nitride, oxinitride, metal, insulation or any other suitable material, and the wafer can be planarized by CMP or other suitable processes without damaging the structure.

The evaporative material can be applied by any suitable means such as chemical vapor deposition, evaporation, spray coating, spin coating, or painting. It should go on dry, or go on wet and then be easily dried. It should then be a solid, and it should not react with other materials in the device either at room temperature or at elevated temperatures (e.g., 50° C. to 300° C.). The material should be capable of being etched by conventional techniques such as Dry etching, wet etching and CMP. It must vaporize at a temperature on the order of 100° C. to 400° C. and be capable escaping through a porous thin film to produce non-conductive, low capacitance voids where the material once was.

In addition, the evaporative material should not contain any contaminants that could poison the fabrication process, and it should not contain etchants or halogens which can react directly with metals or other circuit materials or which can combine with other chemicals (such as water) to form compounds that react with the circuit materials.

Since it is possible that not all molecules or submolecules of the evaporative material will always be one hundred percent removed, it is preferable that the evaporative material not be conductive or contain molecules which contain metal or are otherwise conductive. Such conductivity could short out the circuit and result in device failure.

The evaporative material should have a low atomic weight, and it should be solid a modest temperatures. It must vaporize at higher temperatures, and materials which sublime or decompose are preferable. It should also be soluble in common solvents such as water or alcohol, and it should have a low dielectric constant in order to avoid circuit failure in the event that it is not completely removed.

One of the most important characteristics of the evaporative material is its vaporization point. This point must be high enough that the material is stable at the temperatures at which it is applied to the wafer and low enough that the material can be vaporized without damaging or otherwise affecting the other elements of the device. It has been found that ammonium compounds and other materials which have at least one nitrogen—hydrogen (N—H) bond with no metal or halogens are particularly suitable for use as the evaporative material because they have modest melting points and suitable temperatures of vaporization.

Examples of evaporative materials which are suitable for use in the invention include $NH_4N_3$, $NH_4CHO_2$, $NH_4NO_3$, $N_2H_4—HNO_3$, $C_2H_4N_2O_2$, $CH_4N_2O$, $C_2H_3N_3O_2$, $C_2H_5NO_2$, $C_2H_5NO_4$, $C_2H_5N_3O_2$, $C_2H_7NO_2$, $C_2H_7N_3$, $C_2H_7N_5$, $C_2H_8N_2O_4$, $C_{22}H_{32}N_3O_5$, $H_4N_2O_3$, $CH_6N_4O$, $C_2H_3NO_3$, $CH_4N_2O_2$, and $CH_4N_4O_2$.

The porous material which is deposited over the evaporative material must have a higher melting point than the vaporization temperature of the evaporative material. It should have good porosity, and it should be thin enough to allow for evaporation but thick enough to provide physical structural strength following evaporation of the evaporative material. One particularly suitable material for this purpose is low temperature $SiO_2$.

Figure 5A:
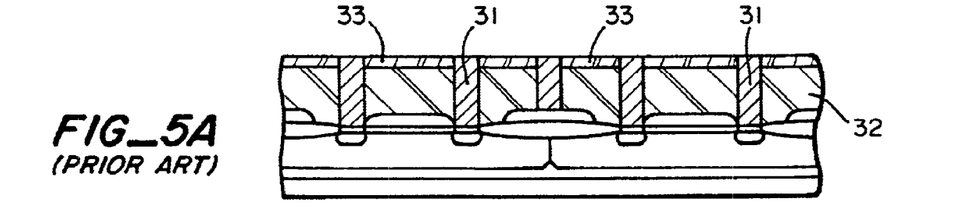
FIGS. 5A–5J are cross-sectional views illustrating the steps in another prior art process for fabricating a semiconductor device.
Figure 5B:
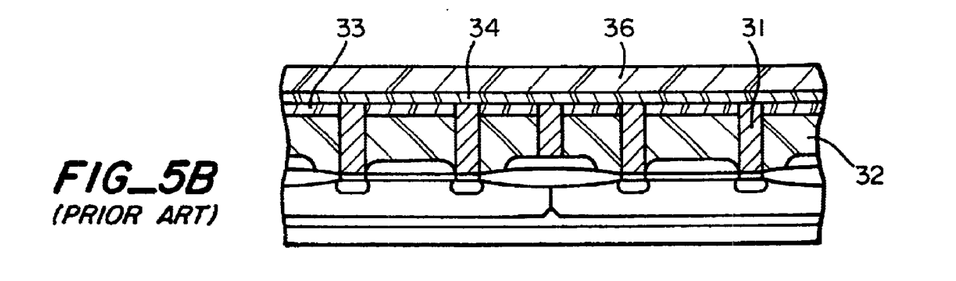
Figure 5C:
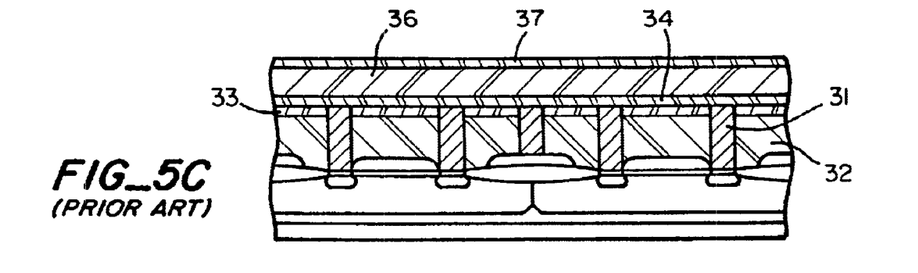
Figure 5D:
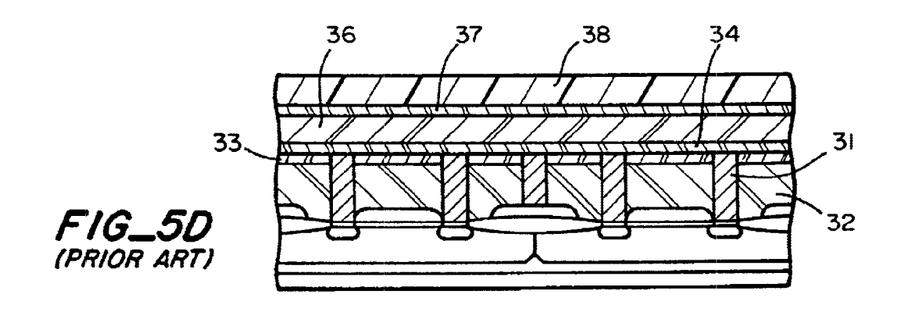
Figure 5E:
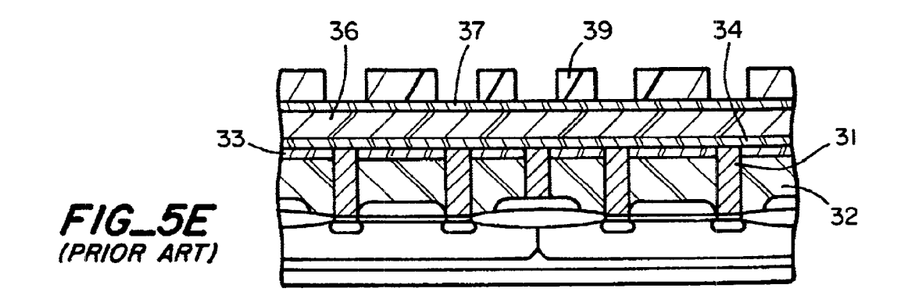
Figure 5F:
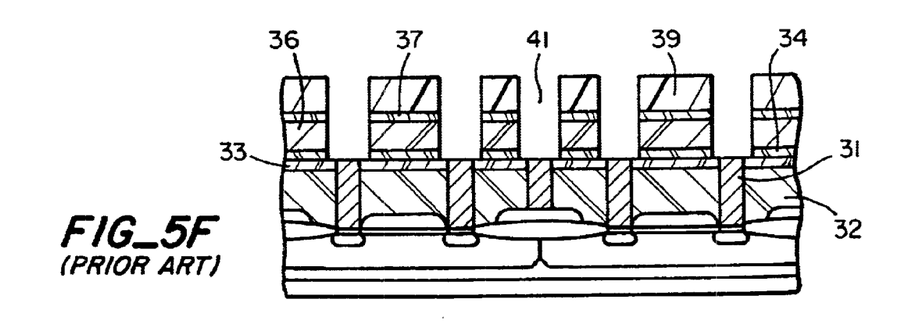
Figure 5G:
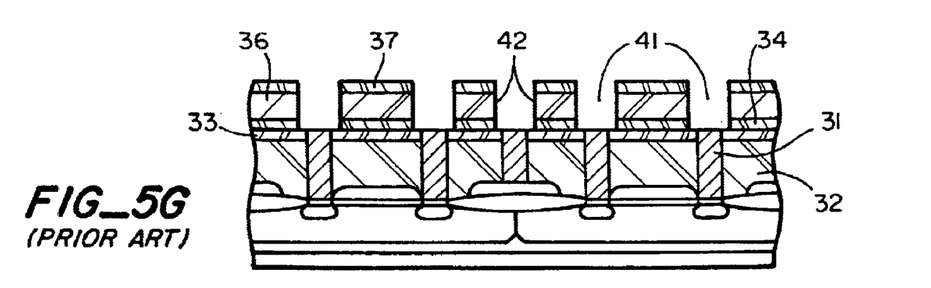
Figure 5H:
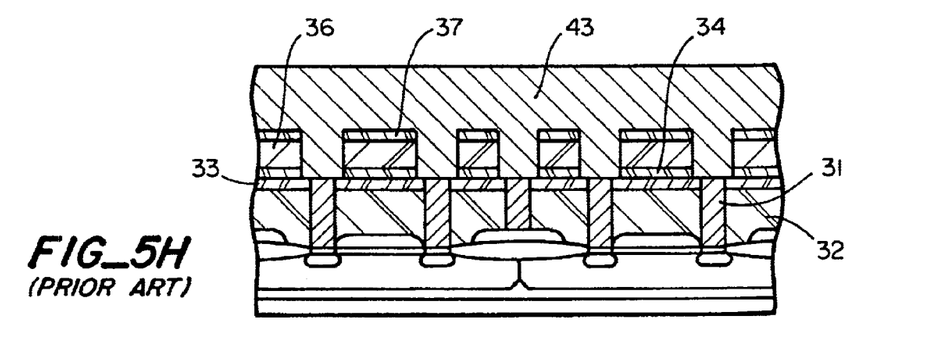
Figure 5I:
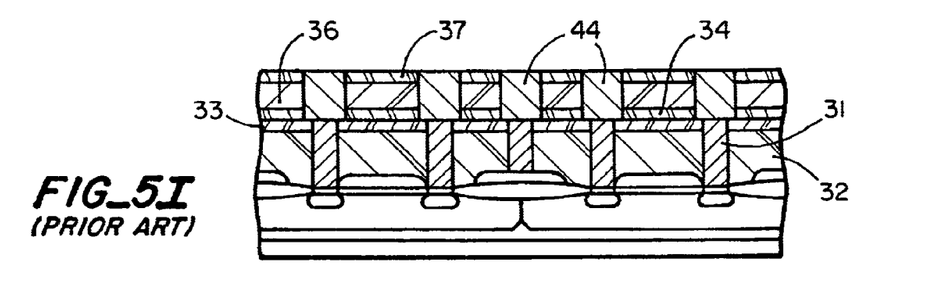
Figure 5J:
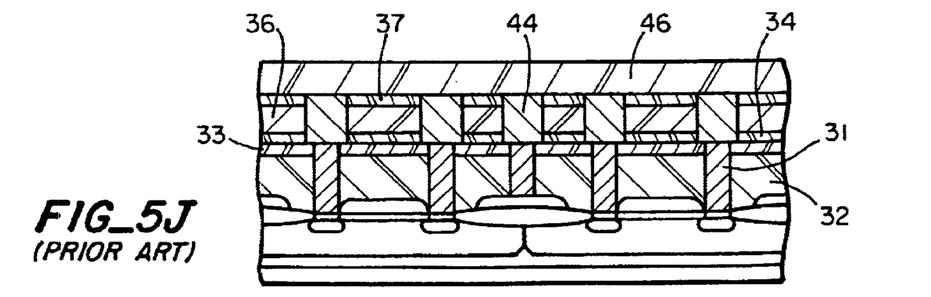

FIGS. 5A–5J illustrate another prior art process, commonly known as a damazine process, for building copper metal layers in a semiconductor structure. As illustrated in FIG. 5A, this process starts with a device which has been partially fabricated with copper plugs 31 passing through a layer 32 of material having a low dielectric constant (low K), with a layer of oxide 33 over the low K material.

A layer of nitride 34 is deposited on the oxide, and another layer of low K material 36 is deposited over the nitride. Another layer of oxide 37 deposited over the low K material, and in some instances, an anti-reflective coating (ARC) may be deposited on the oxide. A layer of photoresist 38 is then deposited on the oxide and patterned to form a mask 39. Holes 41 are then formed, typically in a three-step etching process in which oxide layer 37 is etched through the mask, the photoresist is stripped, the low K material 36 is etched without side wall attack, and finally the nitride layer 34 is etched. A barrier metal 42 is deposited on the side walls of the holes or vias thus formed.

Copper 43 is deposited over the oxide and into the vias, and planarized to the level of the oxide by CMP to form conductors 44. A protective layer of nitride 46 is then deposited over the oxide and the conductors, and the device is now ready for another low K layer to continue the steps necessary for additional metal layers. In this device, the capacitance between the conductors is proportional to the dielectric constant of the low K material between them.

The process illustrated in FIGS. 6A–6J starts with copper plugs 48 and a layer of nonconducting material 49 as in the damazine method discussed above. The invention differs, however, from the damazine process in that the first nonconducting layer does not necessarily need to be a low K material. It can, for example, be $SiO_2$, in which case no oxide cap (i.e., layer 33) is required.

Figure 6A:
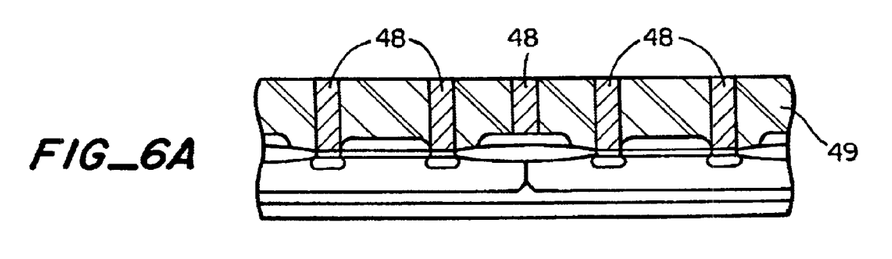
FIGS. 6A–6J are cross-sectional views illustrating the steps in another embodiment of a process for fabricating a semiconductor device in accordance with the invention.
Figure 6B:
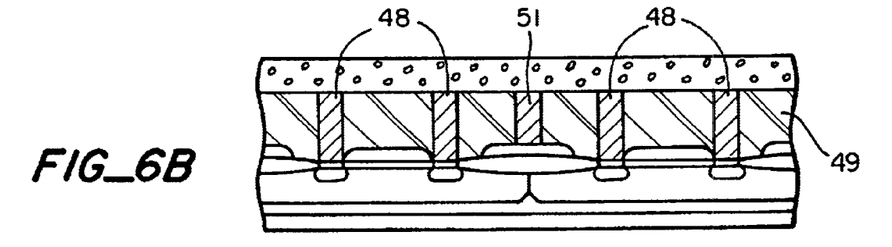
Figure 6C:
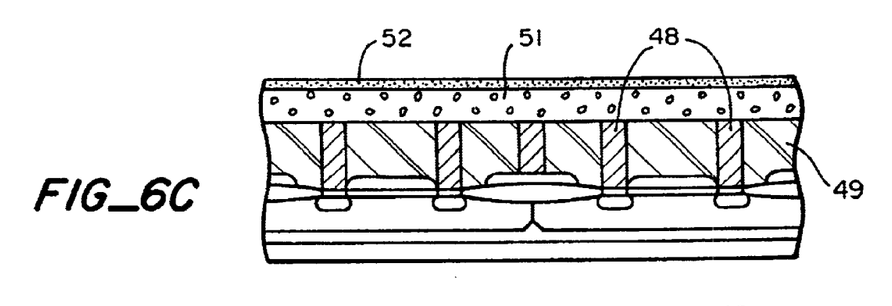
Figure 6D:
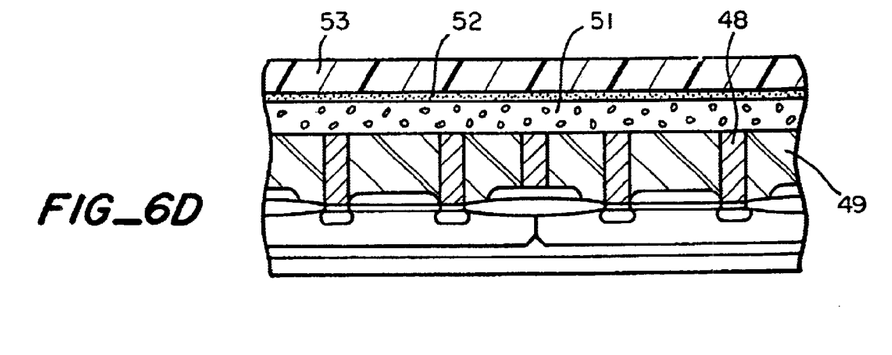
Figure 6E:
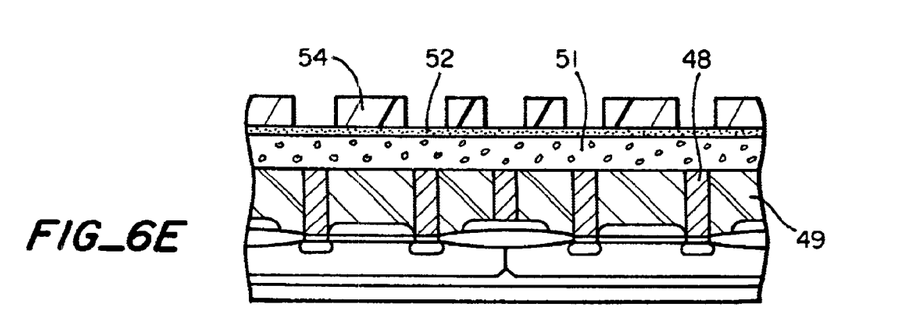
Figure 6F:
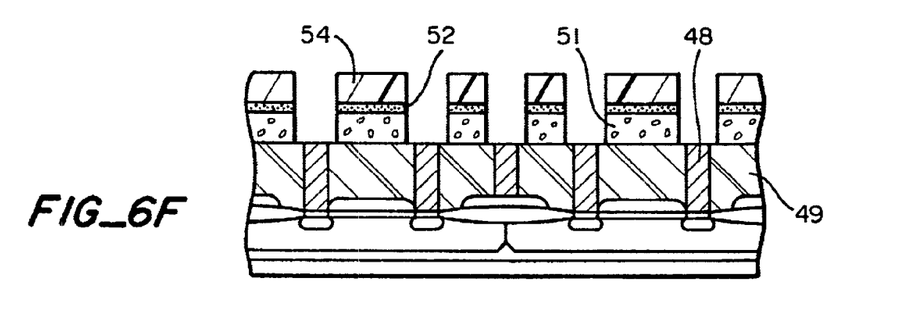
Figure 6G:
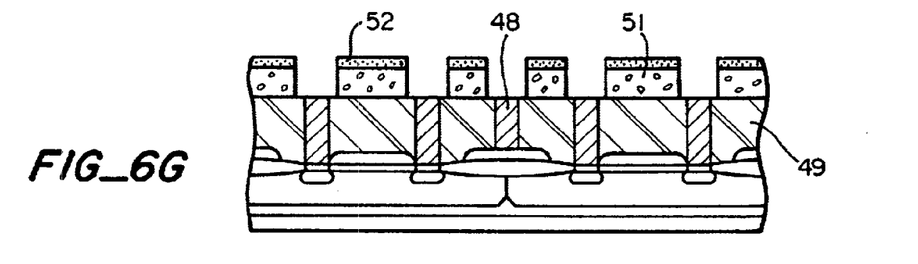
Figure 6H:
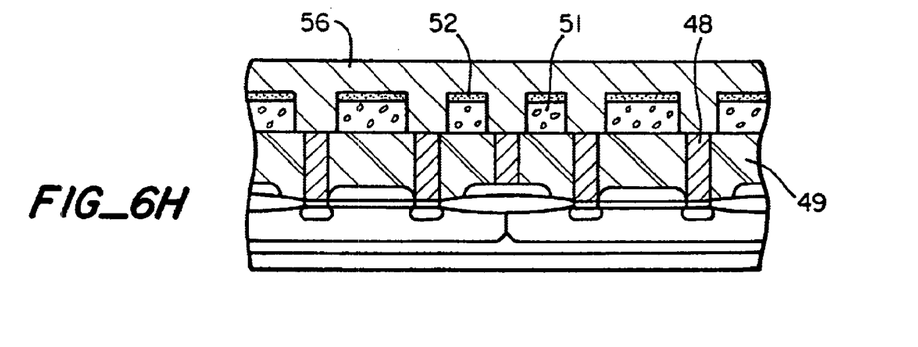
Figure 6I:
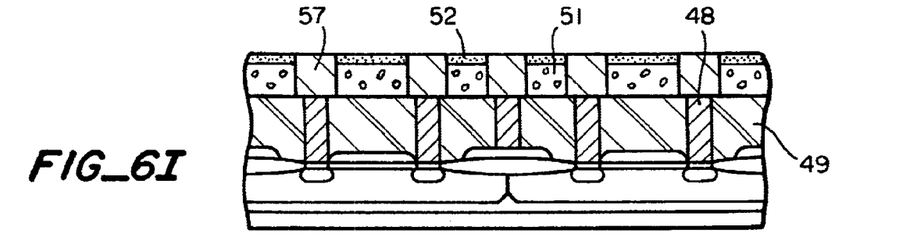
Figure 6J:
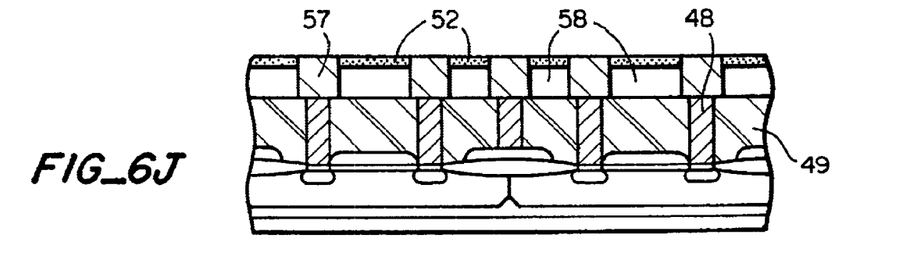

As illustrated in FIG. 6B, a layer of evaporative material 51 is deposited over the $SiO_2$ layer and the copper plugs, and a slightly porous oxide layer 52 is deposited on the evaporative material. Photoresist 53 is deposited on the oxide layer and patterned to form a mask 54.

Oxide 52 and evaporative material 51 are etched through the mask above the copper plugs 48, stopping at oxide layer 49 and the tops of the plugs. This can be done in a two-step process in which the oxide is etched first, stopping at the evaporative material, following which the evaporative material is etched, stopping at the lower oxide layer.

The photoresist is then removed, and copper 56 is deposited over the oxide layer and into the openings formed in the evaporative material. The copper is planarized by CMP to the level of the slightly porous oxide layer to form conductors 57. The wafer is then heated to evaporate the evaporable material through the oxide layer, leaving empty spaces 58 with a dielectric constant approaching 1.0 between the conductors. With the porous oxide layer bridging over the spaces and closing them, the device is ready to receive another oxide layer and another metal layer, or to receive a passivation layer as a completed device.

Figure 7A:
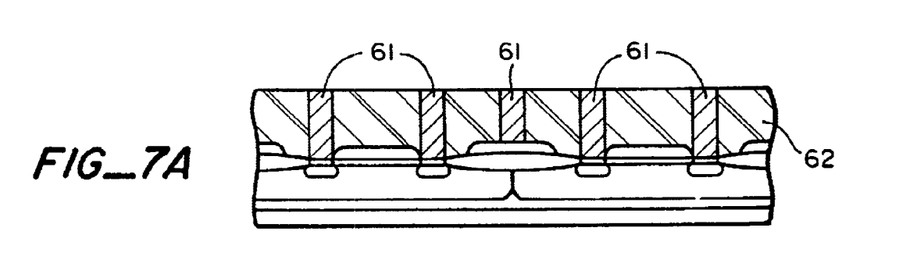
FIGS. 7A–7N are cross-sectional views illustrating the steps in another embodiment of a process for fabricating a semiconductor device in accordance with the invention.
Figure 7B:
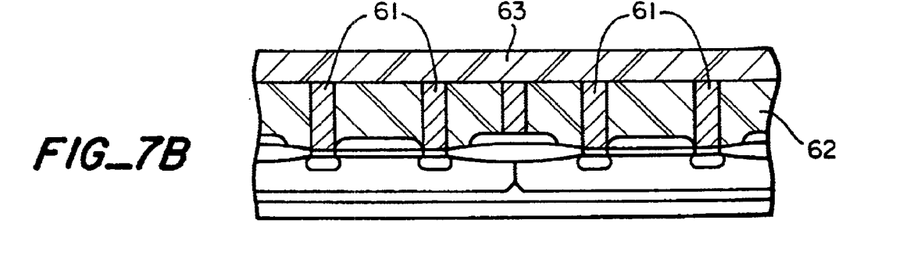
Figure 7C:
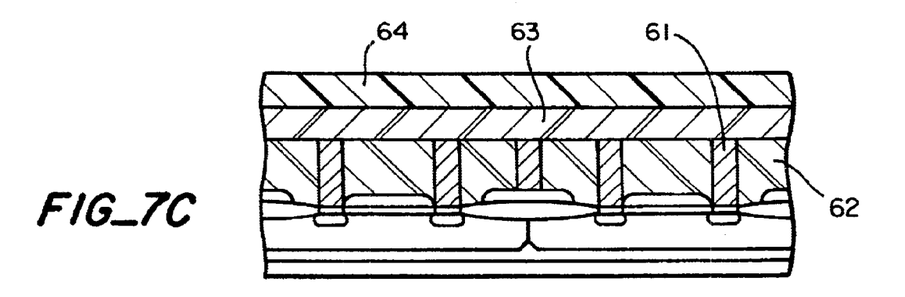
Figure 7D:
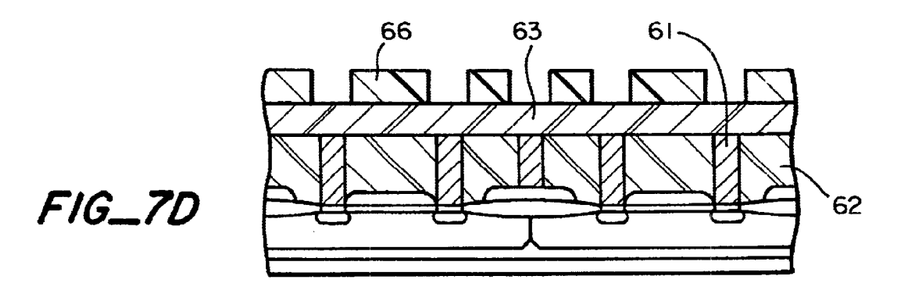
Figure 7E:
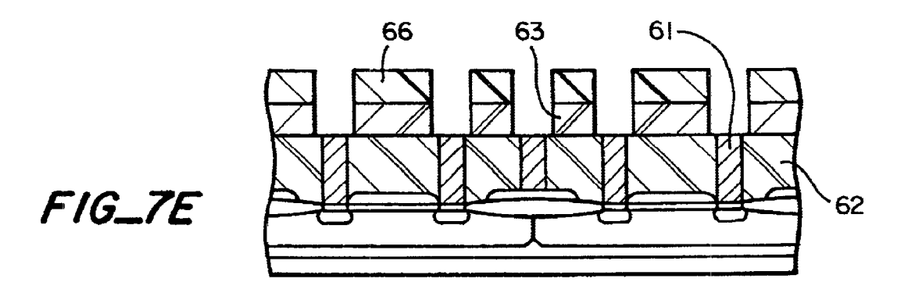
Figure 7F:
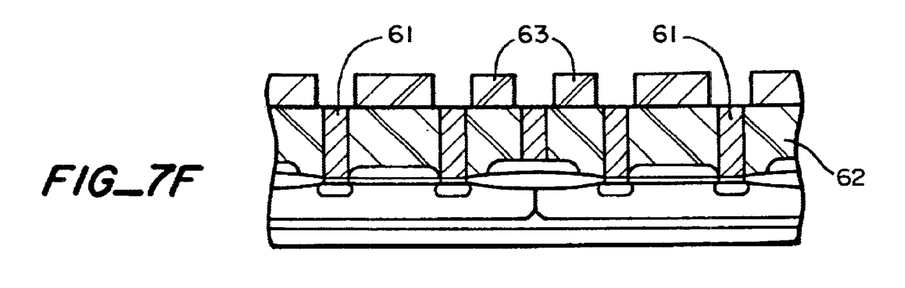
Figure 7G:
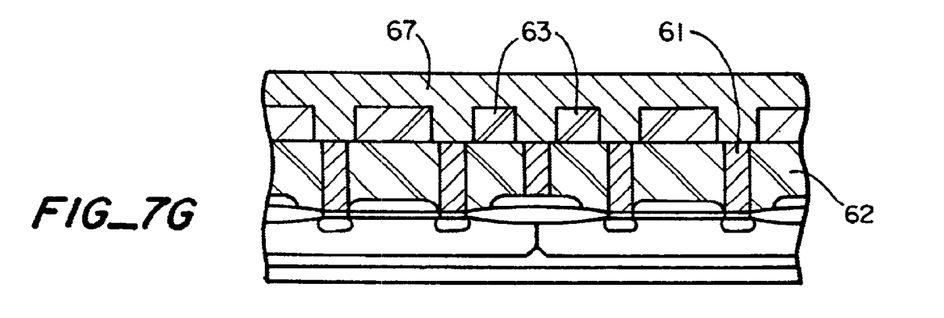
Figure 7H:
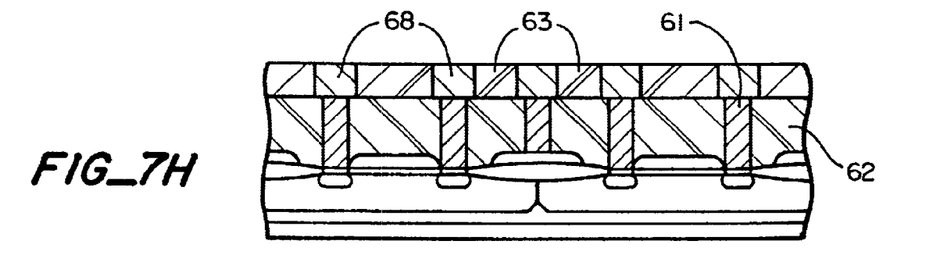
Figure 7I:
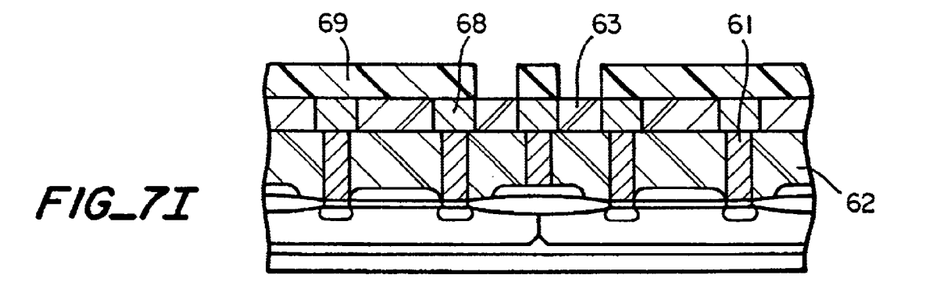
Figure 7J:
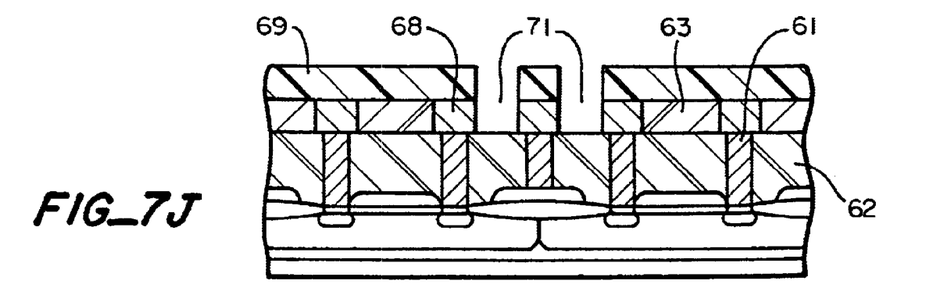
Figure 7K:
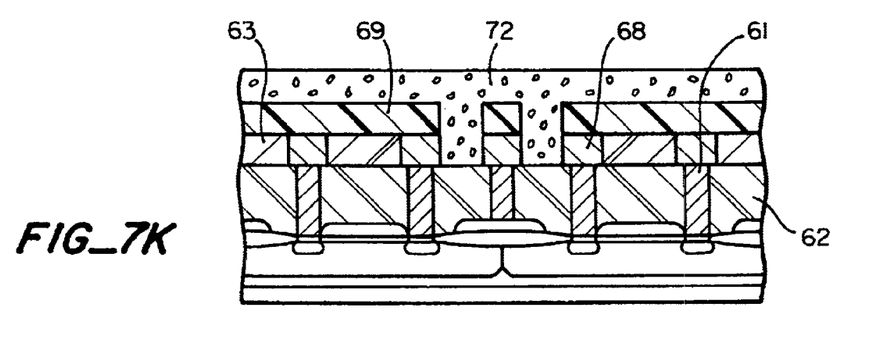
Figure 7L:
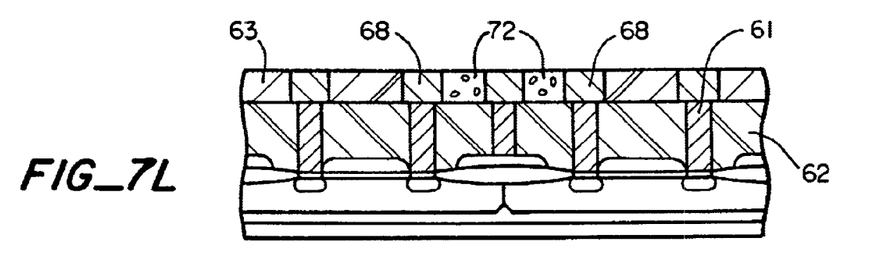
Figure 7M:
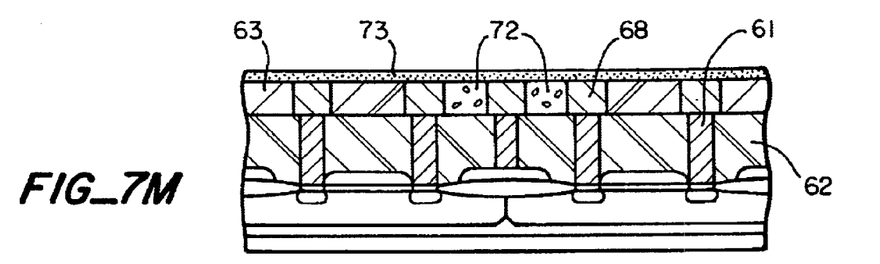
Figure 7N:
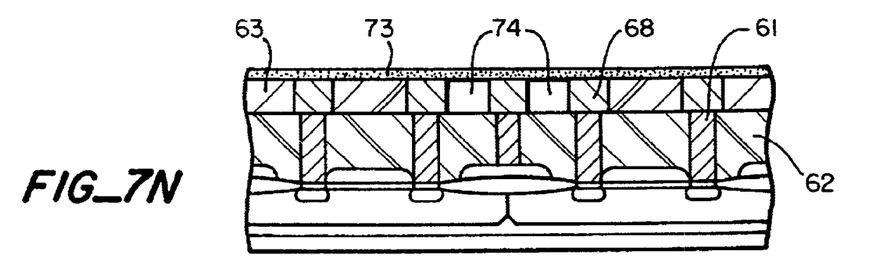

FIGS. 7A–7N illustrate another embodiment of the invention which is suitable for forming smaller voids than the embodiment of FIGS. 6A–6J. This process also starts with copper plugs 61 and a layer of nonconducting material 62, with no oxide cap being required if the nonconducting material is $SiO_2$.

A layer of oxide material such as $SiO_2$ 63 is deposited over the nonconducting material and the plugs. Photoresist 64 is deposited on the oxide layer and patterned to form a mask 66. The oxide is etched through the mask down to the tops of the copper plugs. The photoresist is then removed.

A metal layer 67 is deposited over the oxide layer and in the openings formed in it. The metal is then planarized by a CMP step, stopping at the oxide layer, to form conductors 68. Photoresist is then deposited and patterned to form a mask 69. Oxide layer 63 is then etched through the mask down to the previous oxide layer 62 to form openings 71 between the conductors. If a hard stop is necessary, a nitride layer (not shown) can be placed on oxide layer 62 before the second oxide layer is formed.

A layer of evaporative material 72 is deposited over the mask and the into the openings between the conductors. This material is then etched to the level of oxide layer 63, and the photoresist is removed. Since the etch rate of the evaporative material is typically lower than the etch rate of the photoresist, this can be done in a single step which ends when the photoresist is removed. Alternatively, it can be done with a CMP step in a two-step process in which the evaporative material is removed in a first step and the photoresist is removed in a second step.

A thin porous layer 73, typically oxide, is then deposited, and the wafer is heated to vaporize the evaporative material through the thin porous layer, leaving empty spaces 74 with a dielectric constant approaching 1.0 between the conductors. At this point, the wafer can be processed further to add another metal layer, or a passivation layer can be added to complete the device.

Figure 8A:
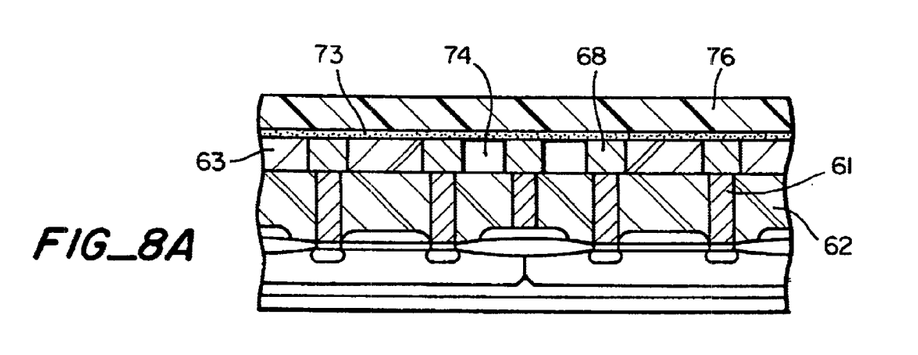
FIGS. 8A–8E are cross-sectional views illustrating additional steps for processing a semiconductor structure fabricated in accordance with the embodiment of FIGS. 7A–7N.
Figure 8B:
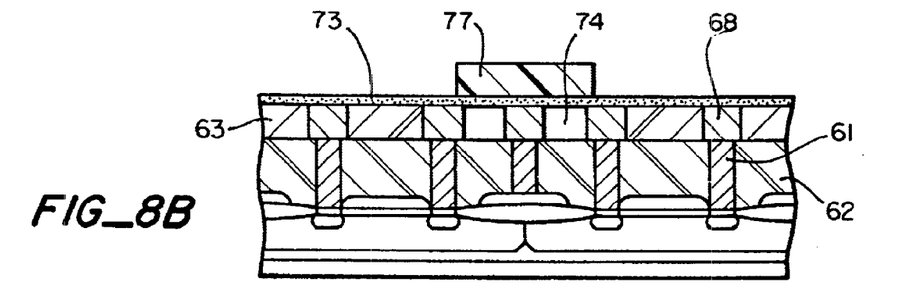
Figure 8C:
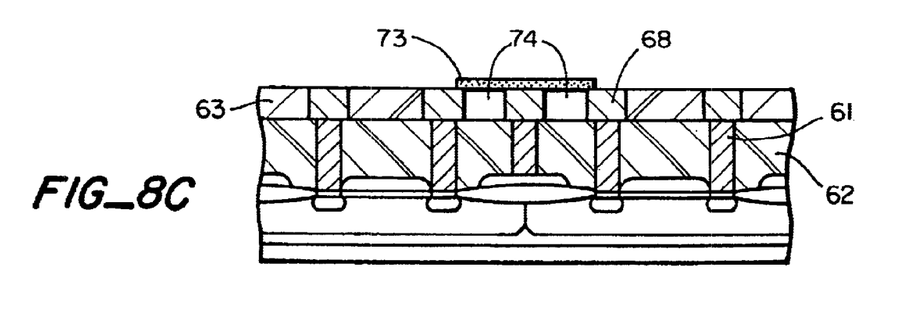

If desired, the layer of porous material can be partially removed before the next insulating layer is deposited. In this regard, as illustrated in FIGS. 8A–8C, a layer of photoresist 76 is deposited over the porous material and patterned to form a mask 77. The exposed portion of the porous material is etched away, and the photoresist is removed, leaving a short bridge of the porous material over the void 74.

Figure 8D:
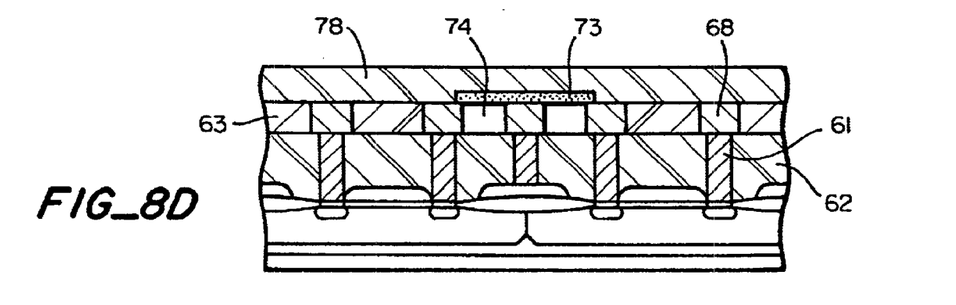
Figure 8E:
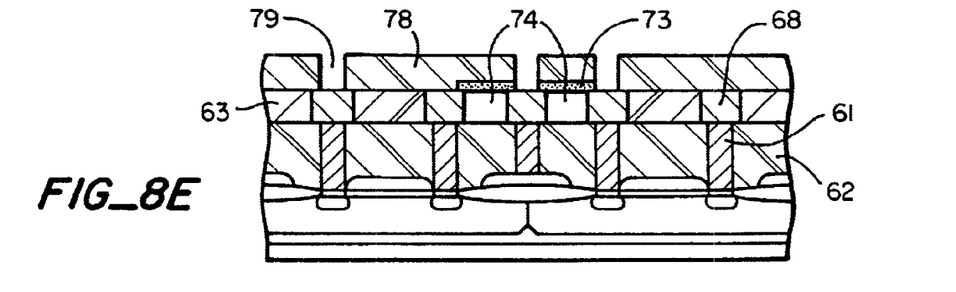

As illustrated in FIGS. 8D–8E, another insulating layer 78, which can also be $SiO_2$, is then deposited over layer 63, and vias 79 can be etched down to the corresponding metal layers as the circuit building process continues.

Figure 9:
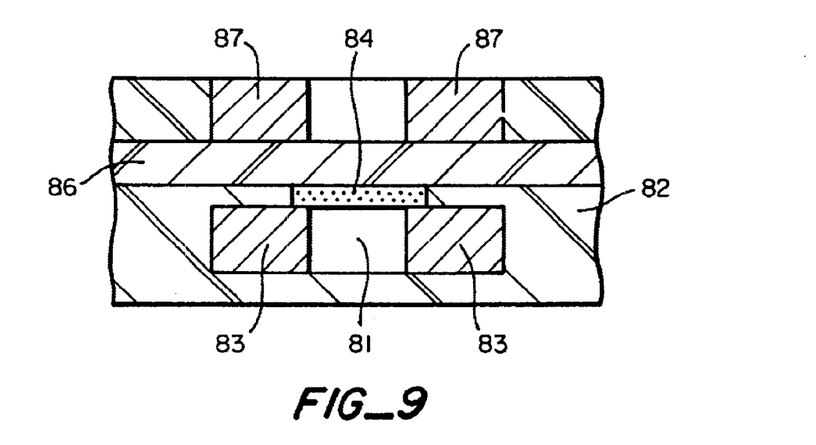
FIG. 9 is a cross-sectional view of another semiconductor structure incorporating the invention.

If desired, the voids provided by the invention can be used in combination with a layer of low K material in order to further reduce the capacitance between conductors in different layers. Thus, as illustrated in FIG. 9, a void 81 is formed in the oxide 82 between metal conductors 83 in one layer, with a porous cap 84 over the void. A layer of low K material 86 is formed between those conductors and the conductors 87 in a higher layer.

The invention has a number of important features and advantages. By providing insulators having a dielectric constant approaching the theoretical limit of 1.0, it significantly reduces capacitive coupling between the conductors of a semiconductor device and allows the device to be made smaller and/or to operate at higher switching speeds. The voids which constitute the insulators are capped before they are formed, and thus there is no difficulty in anisotropic etching and no need for etch selectivity over or under other films. Unlike prior art techniques in which voids were employed, the size and shape of the voids can be precisely controlled, and the capacitances provided by them are consistent, thereby permitting good circuit design.

The invention can be employed both with large voids as well as with voids in small, critical areas. It works both with aluminum conductors and with copper lines. The evaporative material can be used as an anti-reflective coating (ARC) since it can easily absorb light, yet is readily removed in the photoresist stripping process, which prevents the properties of an ARC film from interfering with the circuit design. Also, the complete removal of the evaporative material in a thermal process eliminates the problems of trying to remove all photoresist residue from the wafer surface.

Another important feature and advantage of the invention is that it can be implemented with equipment and know-how that is currently available in the semiconductor industry.

It is apparent from the foregoing that a new and improved semiconductor fabrication process and structure have been provided. While only certain presently preferred embodiments have been described in detail, as will be apparent to those familiar with the art, certain changes and modifications can be made without departing from the scope of the invention as defined by the following claims.

What is claimed is:

1. In a semiconductor fabrication process, the steps of: depositing an evaporative material having at least one N—H bond in a space between two conductors, forming a layer of porous material adjacent to the evaporative material, and evaporating the evaporative material through the porous material to leave a closed empty space between the conductors.

2. The process of claim 1 wherein the material is evaporated at a temperature of 100° C. to 400° C.

3. The process of claim 1 wherein the evaporative material is selected from the group consisting of $NH_4N_3$, $NH_4CHO_2$, $NH_4NO_3$, $N_2H_4$—$HNO_3$, $C_2H_4N_2O_2$, $CH_4N_2O$, $C_2H_3N_3O_2$, $C_2H_5NO_2$, $C_2H_5NO_4$, $C_2H_5N_3O_2$, $C_2H_7N_5$, $C_2H_8N_2O_4$, $C_{22}H_{32}N_3O_5$, $H_4N_2O_3$, $CH_6N_2O_3$, $CH_6N_4$, $CH_6N_4O$, $C_2H_3NO_3$, $CH_4N_2O_2$, and $CH_4N_4O_2$.

4. In a semiconductor fabrication process, the steps of: forming a plurality of spaced apart conductors on a substrate, depositing an evaporative material having at least one N—H bond over the conductors and in spaces between adjacent ones of the conductors, removing the evaporative material above the conductors, depositing a layer of porous material over the evaporative material and the conductors, and evaporating the evaporative material through the porous material to leave closed empty spaces between the conductors.

5. The process of claim 4 wherein the material is evaporated at a temperature of 100° C. to 400° C.

6. The process of claim 4 wherein the evaporative material has a low atomic weight.

7. The process of claim 4 wherein the evaporative material is selected from the group consisting of $NH_4N_3$, $NH_4CHO_2$, $NH_4NO_3$, $N_2H_4$—$HNO_3$, $C_2H_4N_2O_2$, $CH_4N_2O$, $C_2H_3N_3O_2$, $C_2H_5NO_2$, $C_2H_5NO_4$, $C_2H_5N_3O_2$, $C_2H_7NO_2$, $C_2H_7N_3$, $C_2H_7N_5$, $C_2H_8N_2O_4$, $C_{22}H_{32}N_3O_5$, $H_4N_2O_3$, $CH_6N_2O_3$, $CH_6N_4$, $CH_6N_4O$, $C_2H_3NO_3$, $CH_4N_2O_2$, and $CH_4N_4O_2$.

8. In a semiconductor fabrication process, the steps of: depositing an evaporative material over metal plugs and a layer of nonconducting material, depositing a porous layer of oxide over the evaporative material, depositing a layer of photoresist over the oxide layer, patterning the photoresist to form a mask, etching the oxide and the evaporative material through the mask down to the metal plugs to form openings, removing the photoresist to expose the oxide, depositing metal in the openings and over the exposed oxide, planarizing the metal level with the oxide to form a plurality of conductors which are separated by the evaporative material, and evaporating the evaporative material through the porous layer to leave closed empty spaces between the conductors.

9. The process of claim 8 wherein the material is evaporated at a temperature of 100° C. to 400° C.

10. The process of claim 8 wherein the evaporative material has at least one N—H bond.

11. The process of claim 8 wherein, the evaporative material is selected from the group consisting of $NH_4N_3$, $NH_4CHO_2$, $NH_4NO_3$, $N_2H_4$—$HNO_3$, $C_2H_4N_2O_2$, $CH_4N_2O$, $C_2H_3N_3O_2$, $C_2H_5NO_2$, $C_2H_5NO_4$, $C_2H_5N_3O_2$, $C_2H_7NO_2$, $C_2H_7N_3$, $C_2H_7N_5$, $C_2H_8N_2O_4$, $C_{22}H_{32}N_3O_5$, $H_4N_2O_3$, $CH_6N_2O_3$, $CH_6N_4$, $CH_6N_4O$, $C_2H_3NO_3$, $CH_4N_2O_2$, and $CH_4N_4O_2$.

12. In a semiconductor fabrication process, the steps of: forming a plurality of conductors which are separated by oxide, forming a mask of photoresist over the conductors and the oxide, etching through the mask to remove the oxide between adjacent ones of the conductors, depositing an evaporative material over the oxide and between the conductors, removing the evaporative material and the photoresist down to the level of the oxide, depositing a layer of porous material over the oxide, the conductors and the evaporative material between the conductors, and evaporating the evaporative material through the porous material to leave covered empty spaces between the conductors.

13. The process of claim 12 further including the steps of forming a second mask of photoresist material over the layer of porous material, etching the porous material through the second mask to leave only a bridge of porous material which extends between the conductors and over the empty spaces between them, and depositing a layer of insulative material over the oxide, the conductors and the bridge of porous material.

14. The process of claim 13 further including the step of etching through the insulative material and the porous material to from a via which extends down to one of the conductors.

15. The process of claim 13 wherein the material is evaporated at a temperature of 100° C. to 400° C.

16. The process of claim 13 wherein the evaporative material has at least one N—H bond.

17. The process of claim 13 wherein the evaporative material is selected from the group consisting of $NH_4N_3$, $NH_4CHO_2$, $NH_4NO_3$, $N_2H_4$—$HNO_3$, $C_2H_4N_2O_2$, $CH_4N_2O$, $C_2H_3N_3O_2$, $C_2H_5NO_2$, $C_2H_5NO_4$, $C_2H_5N_3O_2$, $C_2H_7NO_2$, $C_2H_7N_3$, $C_2H_7N_5$, $C_2H_8N_2O_4$, $C_{22}H_{32}N_3O_5$, $H_4N_2O_3$, $CH_6N_2O_3$, $CH_6N_4$, $CH_6N_4O$, $C_2H_3NO_3$, $CH_4N_2O_2$, and $CH_4N_4O_2$.

* * * * *